(12) United States Patent
Hong

(10) Patent No.: US 8,135,147 B2
(45) Date of Patent: Mar. 13, 2012

(54) METHOD AND DEVICE FOR ADJUSTING AUDIO VOLUME LEVEL

(75) Inventor: Sug Hoon Hong, Pyeongtaek-si (KR)

(73) Assignee: LG Electronics Inc., Seoul (KR)

( * ) Notice: Subject to any disclaimer, the term of this patent is extended or adjusted under 35 U.S.C. 154(b) by 1188 days.

(21) Appl. No.: 11/869,510

(22) Filed: Oct. 9, 2007

(65) Prior Publication Data

US 2008/0089535 A1    Apr. 17, 2008

(30) Foreign Application Priority Data

Oct. 9, 2006 (KR) .................. 10-2006-0097758
Jul. 30, 2007 (KR) .................. 10-2007-0076270

(51) Int. Cl.
*H03G 3/00* (2006.01)
(52) U.S. Cl. .................. 381/104; 381/107; 381/109
(58) Field of Classification Search .................. 381/104, 381/105, 107, 109, 306, 1, 2; 348/738; 700/94
See application file for complete search history.

(56) References Cited

U.S. PATENT DOCUMENTS

| 7,110,557 | B2* | 9/2006 | Kon et al. | 381/104 |
| 2004/0155974 | A1* | 8/2004 | Hong | 348/333.02 |
| 2007/0206820 | A1* | 9/2007 | Ikawa | 381/104 |

FOREIGN PATENT DOCUMENTS

| KR | 97-24524 A | 5/1997 |
| KR | 20-1998-019003 U | 7/1998 |
| KR | 10-2001-0095091 A | 11/2001 |
| KR | 10-2005-0122849 A | 12/2005 |

* cited by examiner

*Primary Examiner* — Vivian Chin
*Assistant Examiner* — David Ton
(74) *Attorney, Agent, or Firm* — Birch, Stewart, Kolasch & Birch, LLP

(57) ABSTRACT

A method and device for adjusting an audio volume level, are discussed. In an embodiment of the method, the volume steps of at least one preferred volume range and the volume steps of remaining volume ranges are set to be different from each other. The preferred volume range may be determined based on two boundary volume levels input by a user or may be determined based on collected volume data indicating use by the user.

19 Claims, 5 Drawing Sheets

METHOD AND DEVICE FOR ADJUSTING AUDIO VOLUME LEVEL

This application claims the priority benefit of Korean Patent Applications No. 10-2006-97758, filed on Oct. 9, 2006 and No. 10-2007-76270, filed on Jul. 30, 2007, which are hereby incorporated by reference as if fully set forth herein.

BACKGROUND OF THE INVENTION

1. Field of the Invention

The present invention relates generally to a method and device for adjusting an audio volume level.

2. Description of the Related Art

An audio device is a device that converts sound waves within a typical audible frequency band (30~16,000 Hz), such as music, a human voice and natural sounds, into electrical signals and records the electrical signals on a recording medium, or converts the electrical signals into acoustic energy and outputs the acoustic energy into a space. The audio device is chiefly installed in houses, in commercial spaces or in automobiles for use thereof.

Such an audio device may include a tuner for receiving broadcasting signals and tuning a channel selected by a user, an audio source for acquiring audio signals from a storage medium, such as an optical disc or a tape, an amplifier for amplifying the audio signals, and a speaker for outputting the amplified audio signals into the space. Furthermore, the audio device that can record audio signals may further include a microphone for converting sound waves into electrical signals and a recording unit for performing conversion on the audio signals and storing the electrical signals in/on a flash memory, an optical disc, a tape or the like.

The audio device is marketed in a state in which the volume range between the minimum level and the maximum level (for example, Volume 0~Volume 40) is set to be divided into regular steps as shown in FIG. 1. The user of the audio device can adjust the volume level of an audio signal, which will be tuned or reproduced by a tuner or an audio source and output through the speaker, to a desired level according to the surrounding conditions by manipulating a circular knob, which is provided on the front panel of the audio device, or up/down buttons, which is provided on a remote control.

Unlike a conventional analog system, a recent digital audio device does not continuously adjust its audio volume, but adjusts it in steps. That is, the volume steps, at which settings can be made by minimally rotating a circular knob for volume adjustment or by manipulating volume adjustment up/down buttons one time, are pre-determined.

For example, as shown in FIG. 1, the range between the minimum volume 'Volume 0' and the maximum volume 'Volume 40' is divided into regular steps (intervals), that is, a predetermined number of steps (or a predetermined number of volume levels). A volume level is selected in steps through the manipulation of the knob for volume adjustment or the volume adjustment up/down buttons, and thus the audio volume level is adjusted.

In the related art, the volume levels that are chiefly used by the user of the audio device are concentrated within a specific range, that is, the principle volume use range as shown in FIG. 1. However, the entire volume range is set to be divided into uniform interval steps as described above, so that it is difficult to finely adjust the volume level to a level that is desired by the user once the desired level falls within the principle volume use range.

Further, if the entire volume range is set to be divided into narrow steps, it takes a long time to adjust the volume level from a minimum volume level to a maximum volume level or vice verse. Thus, this is not desirable. On the contrary, if the entire volume range is set to be divided into wide steps, it is difficult to finely adjust the volume level, which is also not desirable.

SUMMARY OF THE INVENTION

Accordingly, the present invention has been made keeping in mind the above and other problems and limitations occurring in the related art, and an object of the present invention is to provide a method and device for allowing a user to quickly and finely adjust a desired volume level.

In order to accomplish the above and other objects, the present invention provides according to an embodiment a method of adjusting an audio volume level, including the steps of setting the volume steps of at least one preferred volume range and the volume steps of remaining volume ranges to be different from each other; and adjusting the volume level of the audio signal using the volume steps, which are set to be different from each other.

In addition, the present invention provides according to an embodiment a device for adjusting an audio volume level, including a volume adjustment unit for adjusting the volume level of a reproduced audio signal in response to a control signal; memory for storing volume setting values; and a control unit for storing a volume setting value, which is used to set the volume steps of at least one preferred volume range and the volume steps of remaining volume ranges to be different from each other, in the memory, generating the control signal according to the set volume setting value, and applying the control signal to the volume adjustment unit.

In an embodiment of the present invention, the preferred volume range may be determined based on two boundary volume levels input by a user, or may be determined based on collected volume data indicating use by the user. The volume data includes at least one of the number of uses at each volume level and the accumulative durations of respective volume levels, and only a volume level that has been used for a predetermined duration or more is collected as effective volume information.

Furthermore, in an embodiment of the present invention, the volume steps within the preferred volume range are set to decrease more than the volume steps within the remaining volume ranges. The volume step within the preferred volume range and that of the remaining volume ranges may be set to be regular respectively. Furthermore, the volume steps within the preferred volume range are set to increase gradually in proportion to the distance from a volume level having the highest number of uses or the longest accumulative duration.

Furthermore, in an embodiment of the present invention, two volume level values corresponding to the respective boundaries of the preferred volume range, a volume step value in the preferred volume range, and a volume step value in the remaining volume ranges may be store in the memory as new volume setting values. Furthermore, when the volume setting values are stored in the memory, the volume steps ranging from the lowest volume level value to the highest volume level value are sequentially stored, or the volume level values are sequentially stored.

In addition, the present invention provides according to an embodiment a method for adjusting an audio volume level, employing a preferred volume mode in which volume steps within at least one preferred volume range are set narrow and volume steps within remaining volume ranges are wide, comprising the steps of: confirming current volume level if a specific button is manipulated in the preferred volume mode;

and setting default volume steps as volume steps within the preferred volume range and adjusting the audio volume level using the set default volume steps if the current volume level is confirmed to be located within the preferred volume range.

Furthermore, in an embodiment of the present invention, volume steps wider than the default volume steps are set as volume steps within the remaining volume range and the audio volume level is adjusted using the wider volume steps if the current volume level is confirmed to be located within one of the remaining volume ranges.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

Preferred embodiments of a method and device for adjusting an audio volume level according to the present invention are described in detail below with reference to the accompanying drawings.

In an embodiment of the present invention, volume steps between the volume levels of the volume range that is frequently used by a user (preferred volume range) are set to decrease, and volume steps between the volume levels of the remaining volume ranges are set to relatively increase, so that movement to a desired volume level can be quickly made through minimal manipulation and the volume level can also be finely adjusted within the desired volume range.

And, in another embodiment of the present invention, in a state of a preferred volume mode, in which volume steps of the preferred volume range and volume steps of the remaining volume range are set different from each other, it can be selected whether audio volume adjustment in the preferred volume range is performed finely or rapidly.

Figure 1:
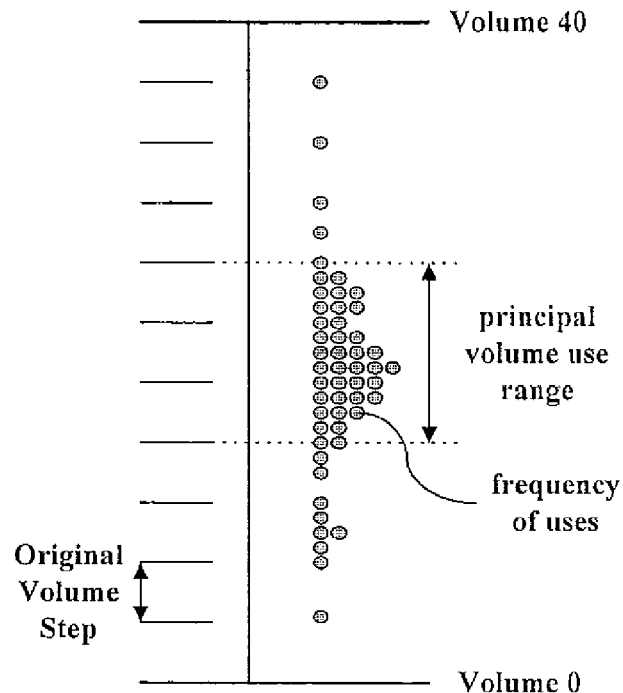
FIG. 1 is a diagram showing a principal volume use range and regular volume steps in an audio device according to a related art.
Figure 2:
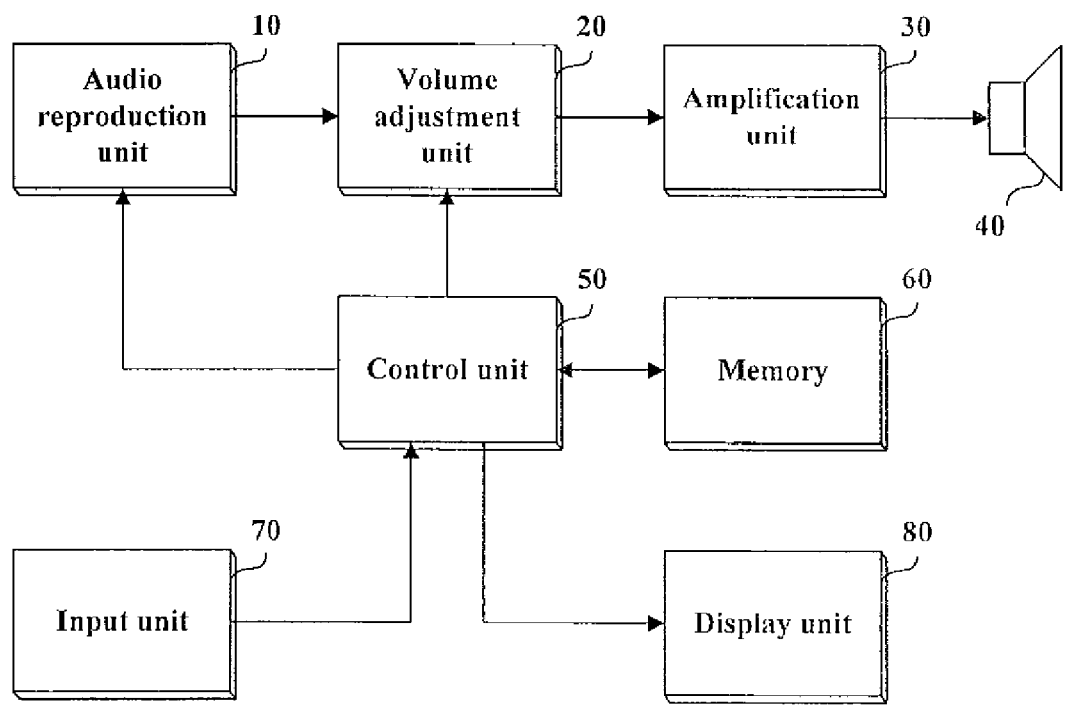
FIG. 2 is a block diagram showing an example of the construction of an audio device according to an embodiment of the present invention, wherein a method of adjusting an audio volume level according to an embodiment the present invention can be applied.

FIG. 2 is a block diagram showing the construction of an audio device to which a method of adjusting an audio volume level according to the present invention is applied.

As shown in FIG. 2, the audio device according to an embodiment of the present invention, such as a car audio device, includes an audio reproduction unit 10, a volume adjustment unit 20, an amplification unit 30, a speaker 40, a control unit 50, memory 60, an input unit 70, and a display unit 80. The audio device can include other components, and all components of the audio device are operatively coupled and configured.

The audio reproduction unit 10 includes, for example, a broadcasting receiver, such as a radio, a compact disc player, a tape recorder, and tunes and reproduces a broadcasting signal or reproduces data recorded on a recording medium, and outputs an audio signal.

The volume adjustment unit 20 adjusts the volume level of the audio signal under the control of the control unit 50. The amplification unit 30 amplifies the volume-adjusted audio signal and outputs the amplified audio signal through the speaker 40.

The input unit 70 for providing interface with a user is preferably installed on the front panel of the audio device, but can be installed differently. The input unit 70 preferably includes a plurality of buttons for selecting or designating various functions, which are supported by the audio device, and menu items. In particular, the input unit 70 may include a circular knob or up/down buttons for adjusting an audio volume level. Furthermore, the input unit 70 may include a reception unit for receiving remote control signals, and thus the audio device can be controlled by a remote control. The input unit 70 may also include touch-sensitive menu items (for example, as part of a touch screen) and/or soft keys.

And, the input unit 70 may be equipped with a specific button dedicated to the function of selecting whether to perform audio volume adjustment finely or rapidly, for example a fast volume function. Or the input unit 70 may provide the fast volume function through the manipulation of the knob or the up/down buttons (for example, simultaneous push of the up/down buttons) or through the combination of the knob (or the up/down buttons) and another button. Other examples are possible.

The display unit 80 includes one or more display windows, such as a Liquid Crystal Display (LCD) window or an Organic Light Emitting Diode (OLED) window, and displays the various functions, menu items and states/modes of the audio device in response to a signal from the control unit 50.

The control unit 50 controls the elements of the audio device. When a user makes a request for the volume adjustment of a reproduction audio signal through the input unit 70, the control unit 50 transmits a corresponding control signal to the volume adjustment unit 20.

Furthermore, the control unit 50 collects volume data, including volume levels, which are selected by the user, and the durations of the respective volume levels, processes the collected volume data into volume use information about the number (frequency) of uses at each volume level and the accumulative duration of each volume level, and stores the volume use information in the memory 60 or other storage. When sufficient volume data is collected, the control unit 50 determines the volume range that is preferred by the user based on the collected volume use information, and adjusts volume steps to be different from each other for respective volume levels or respective volume ranges based on the user preference information. In another example, the user may manually set his preferred volume steps (e.g., his preferred number of volume steps for particular volume range) and other volume control information. The control unit 50 controls the volume adjustment unit 20 based on the adjusted volume steps.

The memory 60, which stores the default volume steps uniformly set for all volume ranges at the early stage, stores additional information which is generated by the control unit 50, specifically, information about the number of uses at each volume level, the accumulative duration of each volume level, at least one preferred volume range, changed volume steps, etc.

If the user selects the preferred volume mode by manipulating the input unit 70, the control unit 50 sets the volume steps within the preferred volume range to decrease, and the volume steps within the remaining volume range to relatively increase.

If the specific button for the fast volume function is manipulated from the input unit 70 in a state in which the preferred volume mode is set in the audio device, the control unit 50 confirms whether a current volume level is located within the preferred volume range, changes the volume steps by the default volume steps stored the memory 60 and adjusts the audio volume level based upon the changed volume steps if the current volume level is confirmed to be located within the preferred volume range.

And, the control unit 50 maintains current volume steps or sets volume steps wider than the default volume steps as the volume steps within the remaining volume range and adjusts the audio volume level using the wider volume steps if the current volume level is confirmed to be located within the remaining volume range. Accordingly, movement to a desired volume level can be quickly made.

Figure 3:
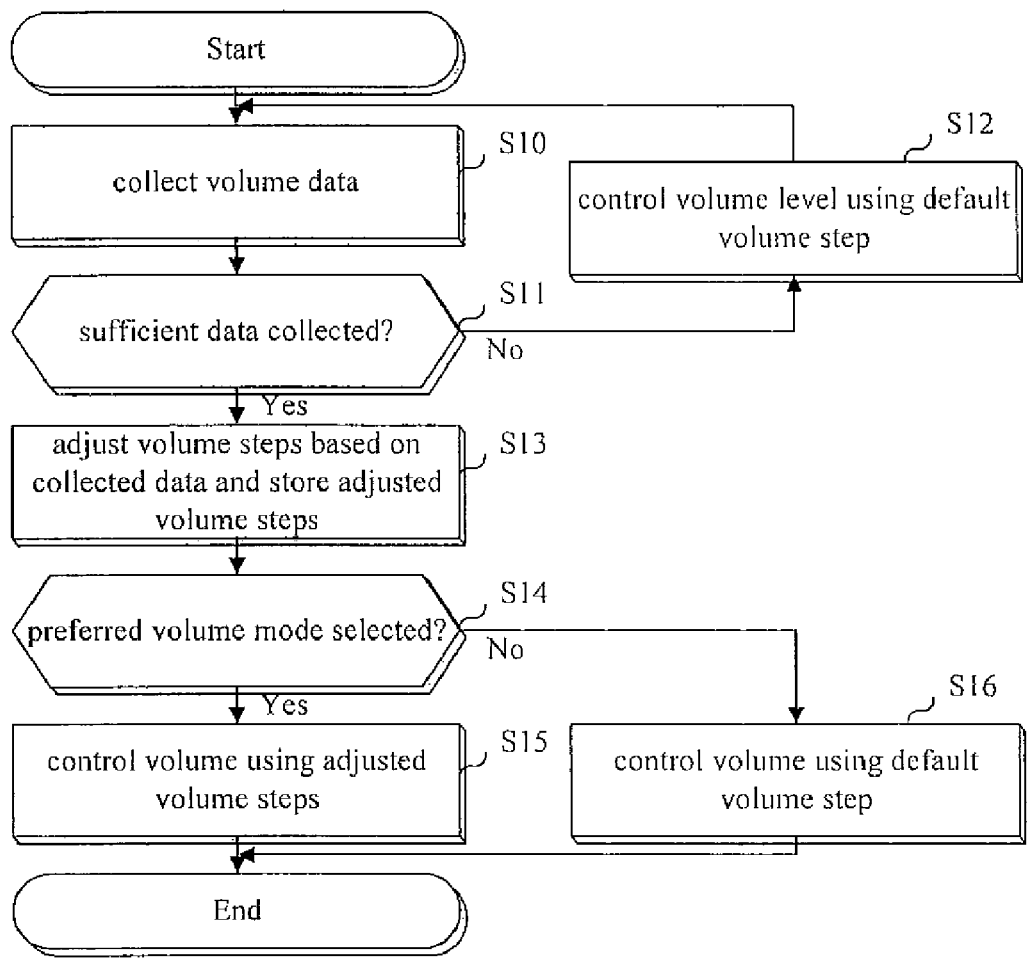
FIG. 3 is a flowchart illustrating the method of adjusting an audio volume level according to an embodiment of the present invention.
Figure 4:
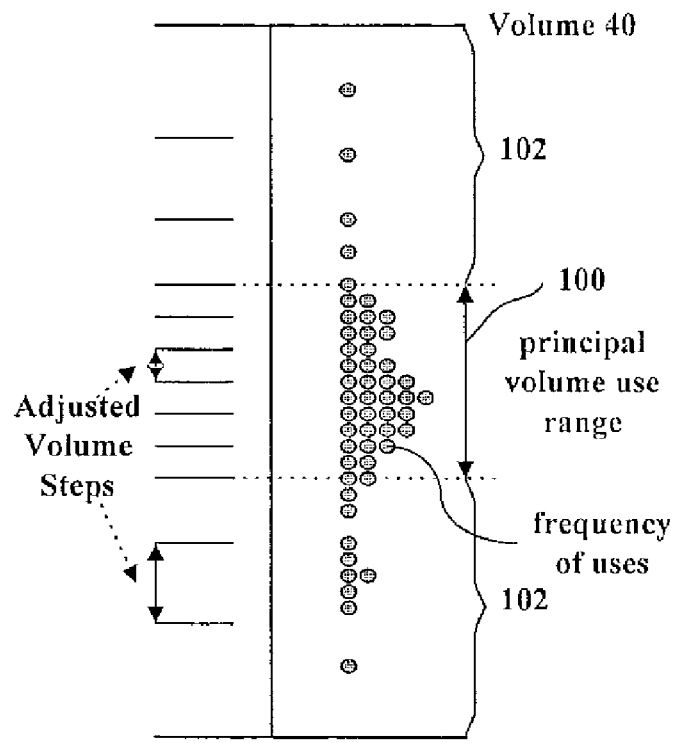
FIGS. 4 and 5 are diagrams showing embodiments of the adjustment of volume steps in the audio device to which the present invention is applied.
Figure 5:
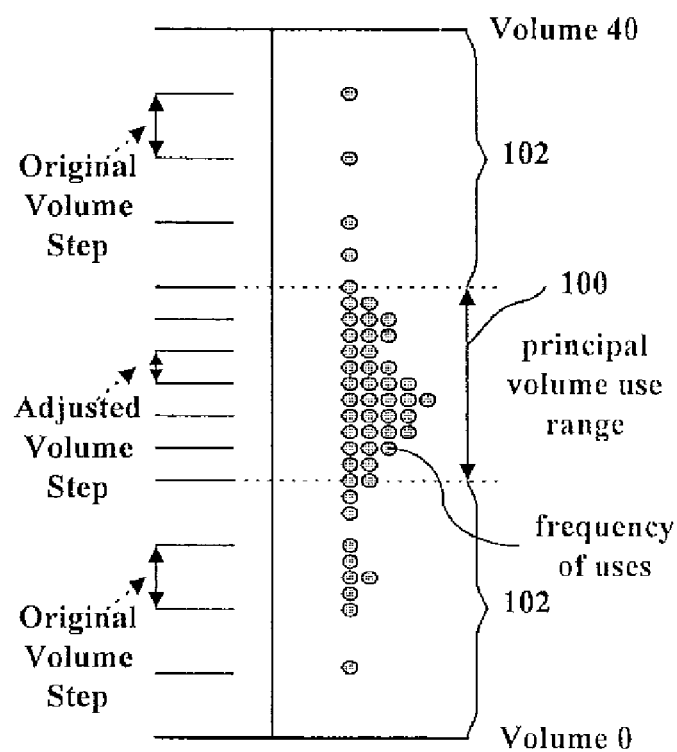

FIG. 3 is a flowchart illustrating a method of adjusting an audio volume level according to an embodiment of the present invention, and FIGS. 4 and 5 are diagrams showing embodiments of the adjustment of volume steps in the audio device to which the present invention is applied.

First, when an audio signal is reproduced, the control unit 50 of the audio device such as a car audio device collects volume data at step S10. In greater detail, the control unit 50 collects the volume data including volume levels selected by the user and the durations of the respective volume levels, processes the collected volume data into volume use information about the number (frequency) of uses at each volume level and the accumulative duration of each volume level, and stores the volume use information in the memory 60. In this case, only a volume level that is continuously used for a predetermined duration or more is collected as effective volume data.

The control unit 50 determines whether sufficient volume data has been collected at step S11. If it is determined that sufficient volume data has not been collected, the control unit 50 adjusts the volume level of the reproduced audio signal using the default volume setting value(s). This default volume setting value for which steps between the overall volume levels are set to be uniform can be stored in the memory 60 in advance.

If it is determined that sufficient volume data has been collected at step S11, the control unit 50 determines the volume range (principal volume use range) that is preferred by the user based on the volume use information managed by the memory 60, sets volume steps to be different from each other for respective volume levels or respective volume ranges, and stores the set volume steps in the memory 60 at step S13.

For example, the control unit 50 detects the range in which the number of uses at each volume level or the accumulative duration is equal to or greater than a predetermined reference value, and determines the range to be the preferred volume range. Accordingly, as shown in FIG. 4, volume steps, which are steps between the volume levels of the preferred volume range 100 (principal volume use range) are set to decrease, whereas volume steps, which are steps between the volume levels of the remaining volume ranges 102, are set to relatively increase. That is, a size of each volume step in the preferred volume range 100 is decreased while a size of each volume step in the other volume ranges 102 is increased. As a variation, the volume steps of the remaining volume ranges 102 may be set using the original default volume setting value without change, as shown in FIG. 5.

Furthermore, the control unit 50 may set the volume steps of the preferred volume range and those of the remaining volume ranges to be regular, respectively. Furthermore, the control unit 50 may set the volume steps to increase gradually in proportion to the distance from the volume level having the highest number of uses or the longest accumulative duration. For instance, the sizes of the volume steps in the preferred volume range 100 may differ from each other depending on the user's volume use information.

In the former case, the two volume level values corresponding to the respective boundaries of the preferred volume range (namely, a volume step value in the preferred volume range, and a volume step value in the remaining volume ranges) may be stored in the memory 60 as new volume setting values.

In the latter case, individual volume steps between adjacent volume levels (among, e.g., Volume 0 to Volume 40), or individual volume level values ranging from the lowest volume level value 'Volume 0' to the highest volume level value 'Volume 40' are sequentially stored in the memory as new volume setting values.

Furthermore, in a manner similar to the above examples, the volume steps of the preferred volume range may be set to increase or decrease in proportion to the distance from the volume level having the highest number of uses or the longest accumulative duration, and the volume steps of the remaining volume ranges may be set have regular or uniform size.

Thereafter, if it is determined at step S14 that a preferred volume mode has been selected by the user through the input unit 70, the control unit 50 reads the new volume setting values managed by the memory 60, and adjusts the actual volume level of the reproduced audio signal according to the new volume setting values when the user makes a request for volume adjustment at step S15. If it is determined at step S14 that the preferred volume mode has not been selected by the user, the control unit 50 adjusts the actual volume level of the reproduced audio signal based on the default volume setting value(s) managed by the memory 60 at step S16.

For instance, when a volume up or down command is input (e.g., the volume adjustment knob or buttons is manipulated) by the user in the preferred volume mode, the control unit 50 determines the current volume level, determines volume steps at the determined current volume level from the volume setting values read from the memory 60, and applies a control signal corresponding to the input command (corresponding to the manipulation extent of the knob or buttons or others) to the volume adjustment unit 20.

When the audio volume level of audio device is adjusted in the preferred volume mode, the control unit 50 also collects volume data, including volume levels and the durations of the respective volume levels, which is selected by the user, processes the volume data to generate volume use information, and stores the volume use information in the memory 60.

Accordingly, the control unit 50 can continuously update the volume setting values, which are used in the preferred volume mode, based on the volume use information.

As described above, the preferred volume range may be determined based on the accumulative volume use information, and may be selected by the user using another method. For instance, the two volume level values corresponding to the respective boundaries of the preferred volume range may be selected by the user, and the volume steps of the selected preferred volume range and the volume steps of the remaining volume ranges may be set to be different from each other.

Meanwhile, the preferred volume mode may be selected or released through several steps of manipulating the input unit 70 according to a menu displayed in the display unit 80. In this case, it is difficult to accomplish fast volume adjustment (quick movement to a desired volume level). With respect to this case, another embodiment of the present invention provides adjusting the volume level quickly in the preferred volume range through the manipulation of the specific button for performing the fast volume function mentioned above.

According to an embodiment, the function of selecting the preferred volume mode and the fast volume function are embodied through one button (the specific button). For example, the preferred volume mode and the default volume mode are toggled whenever the specific button is pushed, and the fast volume function can be set on if the specific button is pushed for a long time. And, the specific button can be separately equipped in the input unit 70 or the fast volume function can be realized in the input unit 70 through the different manipulation of at least one button or the combination of buttons.

Figure 6:
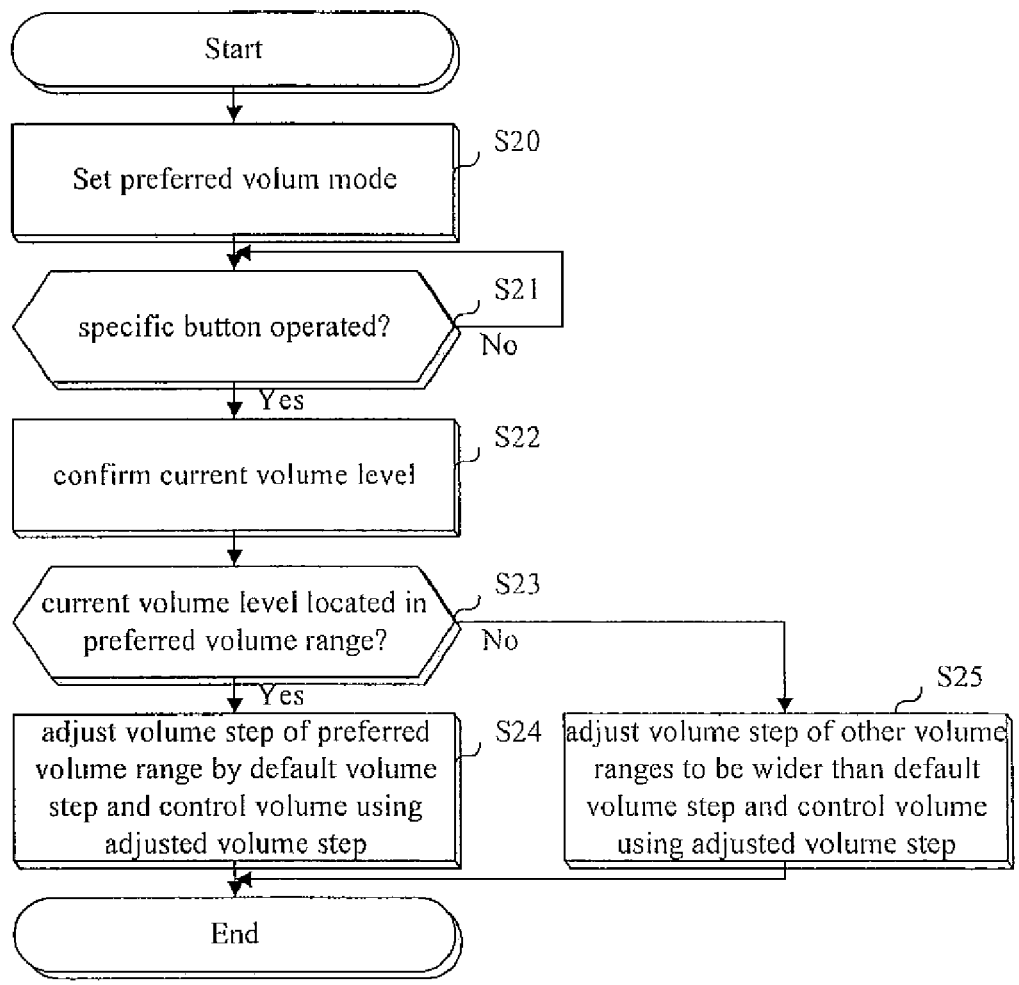
FIG. 6 is a flowchart illustrating a method of adjusting an audio volume level according to another embodiment of the present invention.
Figure 7:
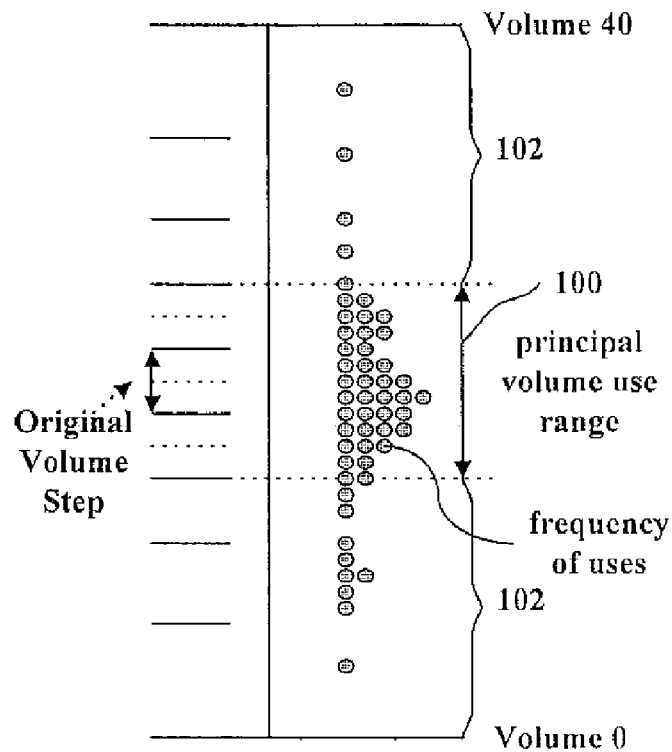
FIGS. 7 and 8 are diagrams showing other embodiments of the adjustment of volume steps in the audio device to which the present invention is applied.
Figure 8:
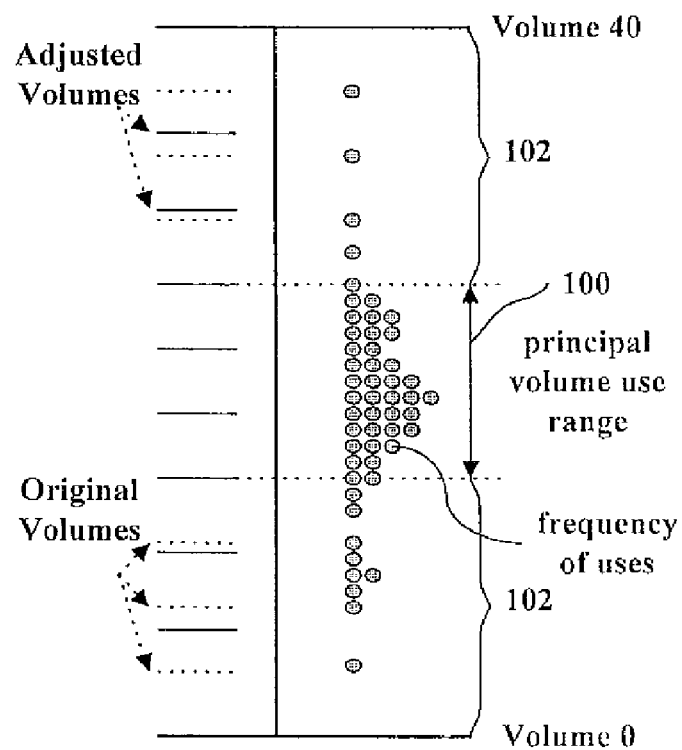

FIG. 6 is a flowchart illustrating a method of adjusting an audio volume level according to another embodiment of the present invention, and FIGS. 7 and 8 are diagrams showing other embodiments of the adjustment of volume steps in the audio device to which the present invention is applied. The methods of the present invention can be implemented in the audio device of FIG. 2 or other suitable device.

If the specific button in the input unit 70 is manipulated by the user at step S21 in a state in which the preferred volume mode is set in the audio device at step S20, the control unit 50 confirms a current volume level at step S22. Here, in the preferred volume mode, initially the volume steps in the preferred volume range are set narrow and the volume steps in the remaining volume range are set wide. And, if the current volume level is confirmed to be located within the preferred volume range at step S23, the control unit 50 reads the default volume setting value(s) from the memory 60 (or other set volume setting value such as shown in FIG. 4) and adjusts the audio volume level using the default/set volume setting value(s) at step S24.

For instance, as shown in FIG. 7, the control unit 50 changes the volume steps in the preferred volume range 100 by the default volume steps included in the default volume setting value as shown in FIG. 8 or by the smaller volume steps as shown in FIG. 4, makes a control signal corresponding to the input command (corresponding to the manipulation extent of the knob or up/down buttons) according to the default volume steps, and then applies the control signal to the volume adjustment unit 20.

And, if the current volume level is confirmed to be located an arbitrary range 102 other than the preferred volume range at step S23, the control unit 50 maintains the current volume steps set in the arbitrary range 102. Or the control unit 50 sets the volume steps of the arbitrary range 102 to be wider than the default volume steps as shown in the FIG. 8 and adjusts the audio volume level using the wider volume steps S25 if the default volume steps are set in the arbitrary range. As a result, in the example of FIG. 8, the range 102 initially has three volume steps ("Original Volumes"), which are then changed at step S25 to wider, two volume steps ("Adjusted Volumes").

Accordingly, movement to a desired volume level can be quickly made. Furthermore, the volume level can be finely adjusted within the desired volume range. And, the volume steps for controlling the volume level can be dynamically adjusted, which improves the user's convenience.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of adjusting an audio volume level, comprising:
setting volume steps of at least one preferred volume range to be different from volume steps of at least one remaining volume range; and
adjusting, by an audio device, a volume level of an audio signal of the audio device using the volume steps,
wherein the preferred volume range is determined based on collected volume data indicating volume use by a user, and
wherein the volume data comprises at least one of a number of uses at each volume level, and accumulative durations of respective volume levels.

2. The method set forth in claim 1, wherein the preferred volume range is determined based on two boundary volume levels input by a user.

3. The method set forth in claim 1, wherein only a volume level that has been used for a predetermined duration or more is collected as the volume data.

4. The method set forth in claim 1, wherein the volume steps within the preferred volume range are smaller in size than the volume steps within the remaining volume range.

5. The method set forth in claim 1, wherein all the volume steps within the preferred volume range, and/or all the volume steps of the remaining volume range have a same size.

6. A method of adjusting an audio volume level, comprising:
setting volume steps of at least one preferred volume range to be different from volume steps of at least one remaining volume range; and
adjusting, by an audio device, a volume level of an audio signal of the audio device using the volume steps,
wherein the volume steps within the preferred volume range are smaller in size than the volume steps within the remaining volume range, and
wherein the volume steps within the preferred volume range are set to increase gradually in proportion to a distance from a volume level having a highest number of uses or a longest accumulative duration.

7. The method set forth in claim 1, wherein the volume steps within the preferred volume range differ from each other in size.

8. A method of adjusting an audio volume level in a preferred volume mode in which volume steps within at least one preferred volume range are set narrow and volume steps within remaining volume ranges are wide, the method comprising:
confirming a current volume level if a specific button is manipulated in the preferred volume mode; and
setting default volume steps as volume steps within the preferred volume range, and adjusting the audio volume level using the set default volume steps if the current volume level is confirmed to be located within the preferred volume range, wherein the preferred volume range is determined based on collected volume data indicating volume use by a user, and wherein the volume data comprises at least one of a number of uses at each volume level, and accumulative durations of respective volume levels.

9. The method set forth in claim 8, further comprising:

setting volume steps wider than the default volume steps as volume steps within the remaining volume range, and adjusting the audio volume level using the wider volume steps if the current volume level is confirmed to be located within one of the remaining volume ranges.

10. A device for adjusting an audio volume level, comprising:

a volume adjustment unit to adjust a volume level of a reproduced audio signal in response to a control signal;

a memory to store volume setting values; and a control unit to store a volume setting value, which is used to set volume steps of at least one preferred volume range to be different from volume steps of remaining volume ranges in the memory, to generate the control signal according to the set volume setting value, and to apply the control signal to the volume adjustment unit, wherein the preferred volume range is determined based on collected volume data indicating volume use by a user, and wherein the volume data comprises at least one of a number of uses at each volume level, and accumulative durations of respective volume levels.

11. The device set forth in claim 10, wherein the control unit temporarily stores a number of uses at each volume level and/or an accumulative duration of each volume level in the memory, and determines a volume range, which is used by a predetermined number of uses or more or used for a predetermined duration or more, to be the preferred volume range.

12. The device set forth in claim 11, wherein the control unit temporarily stores a number of uses at each volume level and/or an accumulative duration of each volume level in the memory, and determines a volume range, which is used by a predetermined number of uses or more or used for a predetermined duration or more, to be the preferred volume range.

13. The device set forth in claim 11, wherein the control unit collects only a volume level that has been used for a predetermined duration or more as the volume data.

14. The device set forth in claim 10, wherein the control unit sets the volume steps of the preferred volume range to be smaller in size than the volume steps of the remaining volume ranges.

15. The device set forth in claim 10, wherein the control unit sets the volume steps of the preferred volume range to have a same size, and/or the volume steps of the remaining volume ranges to have a same size.

16. A device for adjusting an audio volume level, comprising:

a volume adjustment unit to adjust a volume level of a reproduced audio signal in response to a control signal;

a memory to store volume setting values; and a control unit to store a volume setting value, which is used to set volume steps of at least one preferred volume range to be different from volume steps of remaining volume ranges in the memory, to generate the control signal according to the set volume setting value, and to apply the control signal to the volume adjustment unit, wherein the control unit sets the volume steps of the preferred volume range to be smaller in size than the volume steps of the remaining volume ranges, and wherein the control unit sets the volume steps of the preferred volume range to increase gradually in proportion to a distance from a volume level having a highest number of uses or a longest accumulative duration.

17. The device set forth in claim 10, wherein the control unit stores two volume level values corresponding to respective boundaries of the preferred volume rang in the memory as new volume setting values.

18. The device set forth in claim 10, wherein, when storing the volume setting values in the memory, the control unit sequentially stores the volume steps ranging from a lowest volume level value to a highest volume level value, or sequentially stores the volume level values.

19. The device set forth in claim 10, further comprising:

an input unit to provide interface with a user, wherein the control unit confirms a current volume level if a volume fast function is requested through the input unit, sets default volume steps stored in the memory as volume steps within the preferred volume range if the current volume level is confirmed to be located within the preferred volume range, and sets volume steps wider than the default volume steps as volume steps within the remaining volume range if the current volume level is confirmed to be located within one of the remaining volume ranges.

* * * * *